US 6,600,561 B2

(12) United States Patent
Tabei

(10) Patent No.: US 6,600,561 B2
(45) Date of Patent: Jul. 29, 2003

(54) APPARATUS AND METHOD FOR MEASURING PATTERN ALIGNMENT ERROR

(75) Inventor: Kouwa Tabei, Gunma-ken (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 0 days.

(21) Appl. No.: 09/892,927

(22) Filed: Jun. 26, 2001

(65) Prior Publication Data

US 2002/0001083 A1 Jan. 3, 2002

(30) Foreign Application Priority Data

Jun. 30, 2000 (JP) ........................................ 2000-199445

(51) Int. Cl.[7] .............................................. G01B 11/00
(52) U.S. Cl. ...................... 356/401; 356/399; 438/401; 250/491.1; 33/645
(58) Field of Search ................................ 356/401, 399, 356/394; 438/401; 33/645

(56) References Cited

U.S. PATENT DOCUMENTS

| 4,971,444 A | * | 11/1990 | Kato ............................ 356/401 |
| 5,319,444 A | * | 6/1994 | Saitoh et al. ................ 250/548 |
| 5,331,407 A | * | 7/1994 | Doi et al. .................... 356/394 |
| 5,440,394 A | * | 8/1995 | Nose et al. .................. 250/548 |
| 5,498,500 A | * | 3/1996 | Bae ............................. 355/53 |
| 6,023,338 A | * | 2/2000 | Bareket ....................... 356/401 |
| 6,064,486 A | * | 5/2000 | Chen et al. .................. 356/399 |
| 6,083,807 A | * | 7/2000 | Hsu ............................ 257/797 |
| 6,137,578 A | * | 10/2000 | Ausschnitt .................. 356/399 |
| 6,357,131 B1 | * | 3/2002 | Cheng et al. ................ 33/645 |

* cited by examiner

Primary Examiner—Michael G. Lee
Assistant Examiner—Kumiko C. Koyama
(74) Attorney, Agent, or Firm—Morrison & Foerster LLP

(57) ABSTRACT

For measurement of an error of alignment between first and second patterns overlappingly formed on a same substrate, first and second alignment reference marks of predetermined symmetric shapes are formed at a predetermined position of the substrate during formation of the first and second patterns. The first and second marks formed on the substrate are detected optically to obtain dimension detection data of the first or second mark as well as respective position detection data of the first and second marks. Respective symmetry centers of the first and second marks are determined on the basis of the respective position detection data of the first and second marks, and then an error of the alignment between the first and second patterns is determined on the basis of a positional deviation between the symmetry centers of the first and marks. Further, the dimension of the first or second mark is determined on the basis of the dimension detection data, and accuracy of the determination of the alignment error between the first and second patterns is evaluated on the basis of the dimension.

9 Claims, 2 Drawing Sheets

APPARATUS AND METHOD FOR MEASURING PATTERN ALIGNMENT ERROR

BACKGROUND OF THE INVENTION

The present invention relates to apparatus and methods for measuring alignment errors of circuit patterns and the like formed overlappingly on the surface of a semiconductor substrate (e.g., semiconductor wafer). Particularly, the present invention relates to an improved pattern-alignment-error measuring apparatus and method which measure, as the pattern-alignment-error, a positional deviation between first and second alignment reference marks that are formed in predetermined positional relation to each other as patterns are formed overlappingly on a semiconductor substrate. The basic principles of the present invention are applicable not only to pattern formation on semiconductor substrates, but also to pattern formation on glass substrates for liquid crystal displays and plasma displays and other types of substrates.

In manufacture of high-quality and high-performance semiconductor devices (such as Very-Large-Scale Integrated or VLSI circuits), a photomask (reticle) is used in a photo-exposure step to sequentially print predetermined circuit patterns onto a semiconductor wafer. In such a case, there is a possibility of a positional deviation, i.e. alignment error, occurring between the last printed circuit pattern and the current printed circuit pattern. Thus, in order to measure the alignment error between the circuit patterns, a first alignment reference mark of a predetermined symmetrical shape (e.g., square shape) is formed as an etching mark at a predetermined position of the wafer surface during a process of forming of the first circuit pattern layer, and then a second alignment reference mark of a predetermined symmetrical shape (e.g., square frame shape with a predetermined line width) is printed around the first alignment reference mark simultaneously with printing of the next circuit pattern layer. After development of the wafer, the second alignment reference mark is left as a photoresist mark, and thus a positional deviation between the respective symmetrical centers of the first and second alignment reference marks on the developed wafer is measured, as an alignment error of the overlappingly-formed circuit patterns, using a pattern-alignment-error measuring apparatus.

With the conventional patter-alignment-error measuring apparatus arranged to measure, as an alignment error of the overlappingly-formed circuit patterns, a positional deviation between the symmetry centers of the first and second alignment reference marks on the developed wafer, the positional deviation between the symmetry centers of the first and second alignment reference marks can be measured appropriately as the circuit pattern alignment error without any problem, as long as the first and second alignment reference marks are formed exactly into predetermined dimensions (e.g., a mark width between opposite sides in the case of the first alignment reference mark, and a line width in the case of the second alignment reference mark). However, in case the first and second alignment reference marks are not formed exactly to the predetermined dimensions, then the symmetrical centers of the alignment reference marks would deviate from those of the accurately-sized alignment reference marks. As a consequence, the reliability of the alignment reference marks would be impaired, and hence the reliability of the circuit-pattern-alignment-error measurement would be impaired.

SUMMARY OF THE INVENTION

In view of the foregoing, it is an object of the present invention to provide a pattern-alignment-error measuring apparatus and method which achieve enhanced reliability of pattern-alignment-error measurement by determining a dimension of a first or second alignment reference mark.

In order to accomplish the above-mentioned object, the present invention provides an apparatus for measuring an error of alignment between a first pattern and a second pattern overlappingly formed on a same substrate, a first alignment reference mark of a predetermined symmetric shape being formed at a predetermined position of the substrate during formation of the first pattern, a second alignment reference mark of a predetermined symmetric shape being formed, in predetermined positional relationship to the first alignment reference mark, at a predetermined position of the substrate during formation of the second pattern. This apparatus comprises: a detector that optically detects the first alignment reference mark and the second alignment reference mark formed on the substrate and thereby obtains dimension detection data of the first alignment reference mark or the second alignment reference mark as well as respective position detection data of the first and second alignment reference marks; a determination section that determines respective symmetry centers of the first and second alignment reference marks on the basis of the respective position detection data of the first and second alignment reference marks and determines an error of the alignment between the first and second patterns on the basis of a positional deviation between the determined respective symmetry centers of the first and second alignment reference marks; and an evaluation section that evaluates accuracy of determination, by the determination section, of the error of the alignment between the first and second patterns on the basis of the dimension detection data of the first alignment reference mark or the second alignment reference mark.

The present invention is characterized by measuring the dimension of the first or second alignment reference mark in addition to evaluating the accuracy of the measurement of the pattern alignment error and also evaluating the dimension measurement of the first or second alignment reference mark, so that when the first or second alignment reference mark has been formed improperly, the invention can eliminate data of the pattern alignment error measurement. With this arrangement, the present invention can avoid deterioration in the accuracy of the pattern alignment error measurement and thus advantageously perform the pattern alignment error measurement with enhanced reliability. Further, the present invention is characterized in that the dimension detection data of the first or second alignment reference mark is obtained as the position detection data of the reference marks are obtained, so that the pattern alignment error measurement with enhanced accuracy and reliability can be performed in a short time.

The present invention may be constructed and implemented not only as the apparatus invention as discussed above but also as a method invention. Also, the present invention may be arranged and implemented as a software program for execution by a processor such as a computer or DSP, as well as a storage medium storing such a program. Further, the processor used in the present invention may comprise a dedicated processor with dedicated logic built in hardware, not to mention a computer or other general-purpose type processor capable of running a desired software program.

While the embodiments to be described herein represent the preferred form of the present invention, it is to be understood that various modifications will occur to those skilled in the art without departing from the spirit of the invention. The scope of the present invention is therefore to be determined solely by the appended claims.

BRIEF DESCRIPTION OF THE DRAWINGS

For better understanding of the object and other features of the present invention, its embodiments will be described in greater detail hereinbelow with reference to the accompanying drawings, in which:

FIGS. 1A and 1B are diagrams showing a patter-alignment-error measuring apparatus in accordance with an embodiment of the present invention, of which FIG. 1 shows a general setup of the patter-alignment-error measuring apparatus and FIG. 1B is explanatory of first and second alignment reference marks formed on a wafer for pattern alignment error measurement by the apparatus.

DETAILED DESCRIPTION OF EMBODIMENTS

Figure 1A:
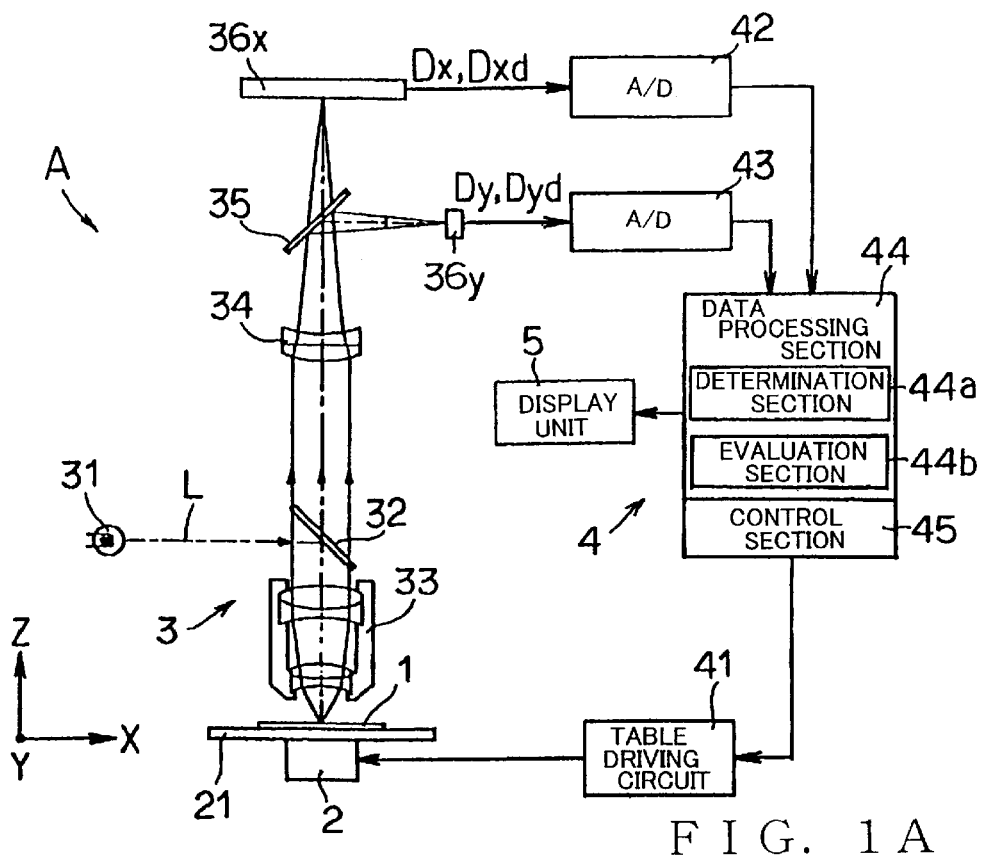
Figure 1B:
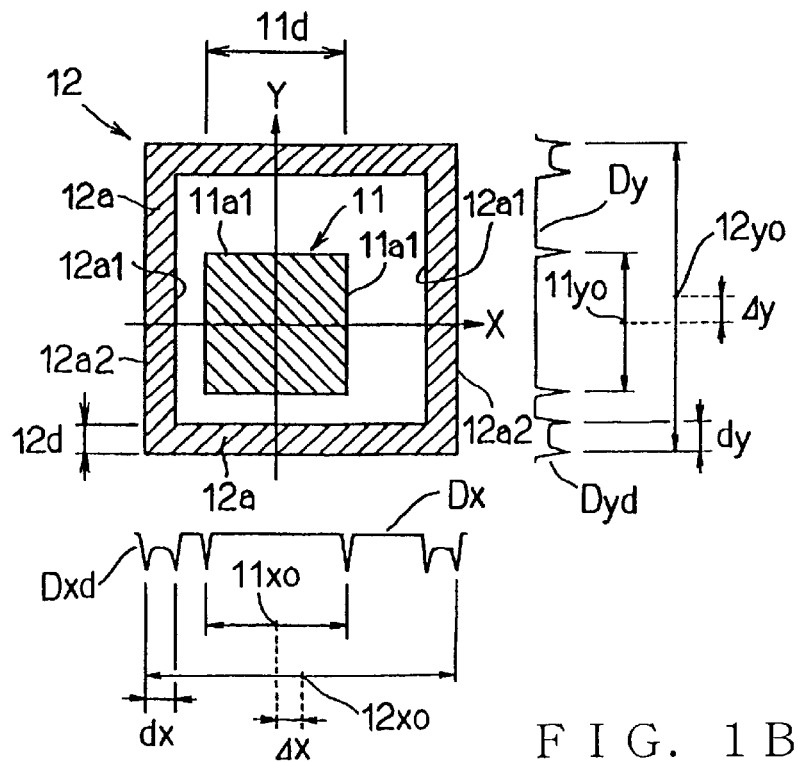

Now, a description will be made about embodiments of a pattern-alignment-error measuring apparatus and method in accordance with the present invention, FIG. 1A is a diagram schematically showing a general setup of the pattern-alignment-error measuring apparatus A of the invention, which is advantageously applied to measurement of an alignment error between circuit patterns to be sequentially formed overlappingly on a semiconductor wafer (hereinafter also called a "wafer") 1. Namely, when a plurality of circuit patterns are to be formed sequentially overlappingly on the surface of the wafer 1 (the wafer surface is also described with reference character 1) while aligning one circuit patten to another, the pattern-alignment-error measuring apparatus A measures an alignment error between the circuit pattern last formed on the wafer 1 and the circuit pattern to be currently printed on the wafer 1 in overlapping relation to the last formed circuit pattern. For this purpose, a first alignment reference mark 11 of a predetermined symmetric shape is formed as an etching mark at a predetermined position of the wafer surface 1 during a process of forming of a first circuit pattern onto the wafer surface 1, as shown in FIG. 1B. Also, a second alignment reference mark 12, having a predetermined symmetric shape different from that of the first alignment reference mark 11, is printed on the wafer surface 1 in predetermined positional relation to the first alignment reference mark 11 during printing of a second circuit pattern onto the wafer surface 1. After completion of development of the wafer 1, the second alignment reference mark 12 is left as a photoresist mark, and thus a positional deviation between the first and second alignment reference marks on the developed wafer 1 is measured as an alignment error of the two circuit patterns.

In the illustrated example, the first alignment reference mark 11 is shaped into a square having four equal sides, which has a symmetry center coinciding with two centers 11xo and 11yo between edges 11a1 of the sides located oppositely to each other in X and Y directions. The second alignment reference mark 12 is formed into a square frame shape consisting of four equal lines 12a, which has a symmetry center coinciding with two centers 12xo and 12yo between outer edges 12a2 (or inner edges 12a1) of the lines 12a located oppositely to each other in the X and Y directions. All of the lines 12a are equal in line width 12d. When the current circuit patter is printed on the wafer 1, the second alignment reference mark 12 is printed on the wafer 1 around the first alignment reference mark 11.

The first alignment reference mark 11 is formed initially as an etching mark on the wafer 1 during the process of forming of the first circuit pattern, as noted above. In forming of the second or subsequent circuit patterns, however, in order to allow accurate measurement of an alignment error between the last printed circuit pattern (e.g., second circuit pattern) and the current printed circuit pattern (e.g., third circuit pattern), another first alignment reference mark 11 is printed, along with the current second alignment reference mark 12, at a position different from the last-formed first alignment reference mark 11, and thereafter the other first alignment reference mark 11 is formed as an etching mark through an etching process. In this case, the dimension 11d between the edges 11a1, oppositely located to each other in the X or Y direction, of the first alignment reference mark 11 tends to change due to lens aberration during the circuit pattern printing, and tends to become smaller than a predetermined value by the first alignment reference mark 11 being scratched during a cleaning step performed after the development of the wafer 1. Similarly, the dimension (width) 12d of the lines 12a tends to change due to the lens aberration during the circuit pattern printing, and tends to become smaller than a predetermined value by the second alignment reference mark 12 being scratched during the cleaning step performed after the development of the wafer 1. If the dimension 11d and line width 12d of the first alignment reference mark 11 and second alignment reference mark 12 change like this, the accuracy of the alignment reference marks 11 and 12 themselves would be impaired, which makes it difficult to accurately measure an alignment error between the circuit patterns. To provide a solution to the inconvenience, the pattern-alignment-error measuring apparatus A of the present invention is designed to not only measure a positional deviation between the first and second alignment reference marks 11 and 12 but also measure, for example, the dimension (line width) 12d of the second alignment reference mark 12.

For that purpose, the pattern-alignment-error measuring apparatus A of the present invention includes an X-Y-Z stage 2 for placing thereon the wafer 1, an optical unit 3, a control unit 4, and a display unit 5 including, for example, a video display device and a printer. The X-Y-Z stage 2 has a wafer chuck 21 movable via a table driving circuit 41 in the X, Y and Z directions shown in FIG. 1A. With the wafer chuck 21, the first and second alignment reference marks 11 and 12 are positioned at predetermined positions relative to the optical unit 3. Operation of the table driving circuit 41 is controlled by a control section 45 of the control unit 4.

The optical unit 3 is disposed immediately above the X-Y-Z stage 2. In the optical unit 3, an illuminating light L from a light source 31 is directed through a half mirror 32 to an objective lens 33, via which the light L is focused on and around the first and second alignment reference marks 11 and 12 formed on the wafer 1. The objective lens 33 directs the light L, reflected off the first and second alignment reference marks 11 and 12 and wafer regions neighboring the first and second alignment reference marks 11 and 12, to an imaging lens 34 through the above-mentioned half mirror 32. Via another half mirror 35, the imaging lens 34 focuses the reflected light L on respective pixel surfaces of X- and Y-direction linear sensors 36x and 36y. In this state, the wafer 1 is moved, relative to the X- and Y-direction linear sensors 36x and 36y, in the X and Y directions as shown in FIG. 1B by means of the wafer chuck 21 on the X-Y-Z stage 2.

The X-direction linear sensor 36x detects levels, in the X direction shown in FIG. 1B, of the reflected light from the first and second alignment reference marks 11 and 12, and generates analog electrical signals corresponding to the detected light levels of the reflected light from the first and second alignment reference marks 11 and 12. Namely, the X-direction linear sensor 36x outputs, as dimension detection data Dxd, the electrical signal corresponding to the detected light levels of the reflected light from one of the lines (lines scanned in the X direction, i.e. vertical lines in FIG. 1B) of the second alignment reference mark 12. Also, the X-direction linear sensor 36x outputs, as position detection data Dx, 1) the above-mentioned electrical signal corresponding to the detected light levels of the reflected light from one of the lines of the second alignment reference mark 12, 2) the electrical signal corresponding to the detected light levels of the reflected light from each of the edges 11a1 of the first alignment reference mark 11 and 3) the electrical signal corresponding to the detected light levels of the reflected light from the other vertical line of the second alignment reference mark 12.

Similarly, the Y-direction linear sensor 36y detects levels, in the Y direction shown in FIG. 1B, of the reflected light from the first and second alignment reference marks 11 and 12, and generates analog electrical signals corresponding to the detected light levels of the reflected light from the first and second alignment reference marks 11 and 12. Namely, the Y-direction linear sensor 36y outputs, as dimension detection data Dyd, the electrical signal corresponding to the detected light levels of the reflected light from one of the lines (lines scanned in the Y direction, i.e. horizontal lines in FIG. 1B) of the second alignment reference mark 12. Also, the Y-direction linear sensor 36y outputs, as position detection data Dy, 1) the above-mentioned electrical signal corresponding to the detected light levels of the reflected light from one of the lines of the second alignment reference mark 12, 2) the electrical signal corresponding to the detected light levels of the reflected light from each of the edges 11a1 of the first alignment reference mark 11 and 3) the electrical signal corresponding to the detected light levels of the reflected light from the other horizontal line of the second alignment reference mark 12.

In the electrical signals thus generated by the X- and Y-direction linear sensors 36x and 36y, the signal levels related to the wafer regions where the first and second alignment reference marks 11 and 12 are present (hatched regions in FIG. 1B) are lower than the signal levels related to the other wafer regions where the first and second alignment reference marks 11 and 12 are not present (white-out regions in the figure). Namely, for the wafer regions where the first and second alignment reference marks 11 and 12 are present, the illuminating light L is diffusely reflected from the edges 11a1, 12a1 and 12a2 so that a reduced portion of the reflected light L passes through the objective lend 33, while for the wafer regions where the first and second alignment reference marks 11 and 12 are not present, the illuminating light L is regularly reflected so that an almost entire portion of the reflected light L passes through the objective lend 33. As a consequence, the detected light levels for the wafer regions where the first and second alignment reference marks 11 and 12 are present are lower than the detected light levels for the other wafer regions where the first and second alignment reference marks 11 and 12 are not present. The position and dimension detection data Dx, Dxd and Dy, Dyd thus output from the X- and Y-direction linear sensors 36x and 36y are supplied, via corresponding A/D converters 42 and 43, to a data processing section 44.

Figure 2:
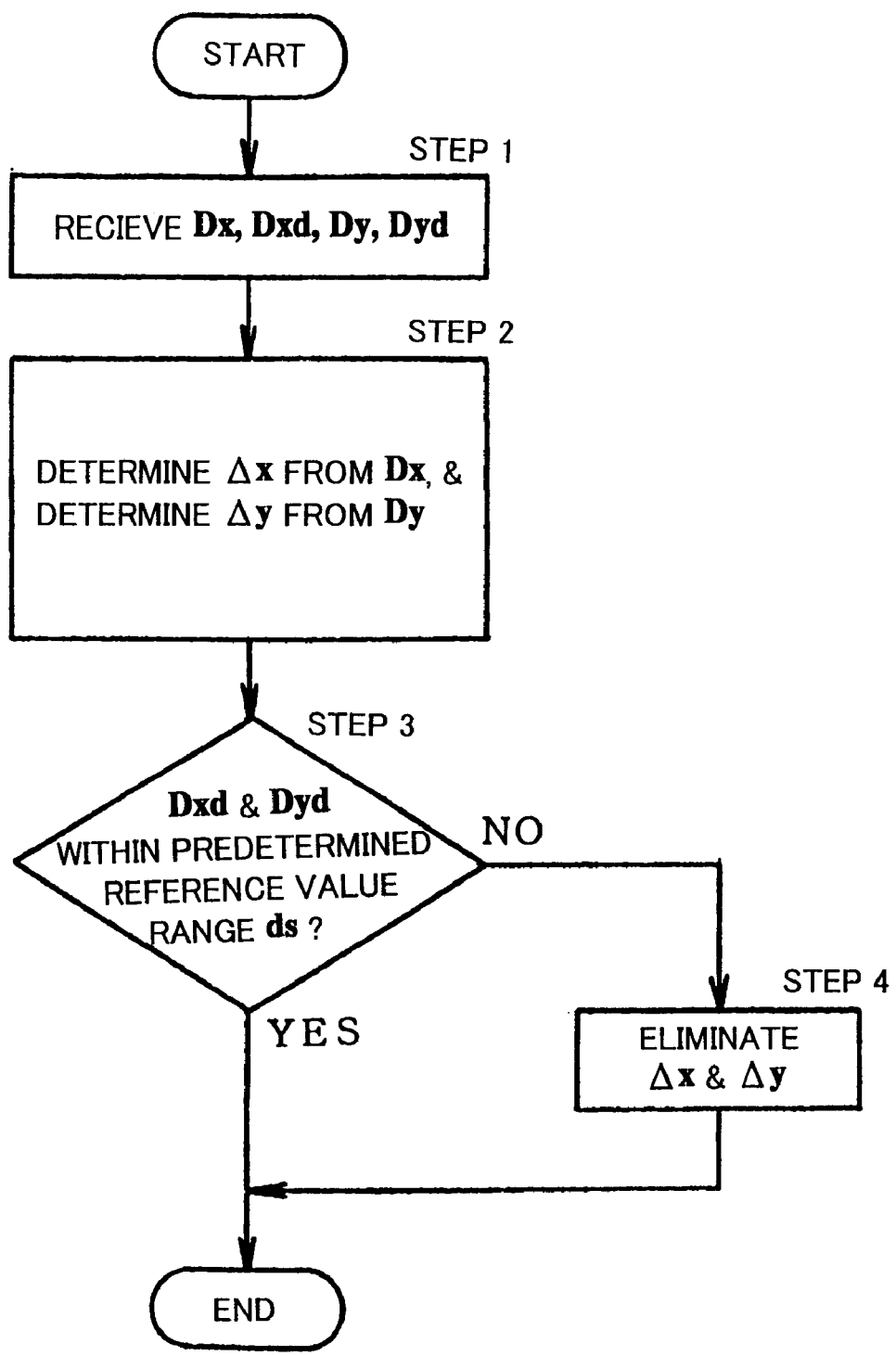
FIG. 2 is a flow chart showing an exemplary step sequence of a process performed by a data processing section for measuring an alignment error between circuit patterns and determining accuracy of the measurement.

FIG. 2 is a flow chart showing an exemplary step sequence of a process performed by the data processing section 44 for measuring an alignment error between circuit patterns. At first step 1, the data processing section 44 receives the position and dimension detection data Dx, Dxd and Dy, Dyd from the A/D converters 42 and 43. At step 2, a determination section 44a of the data processing section 44 determines a circuit pattern alignment error on the basis of the position detection data Dx and Dy. Namely, the determination section 44a determines the symmetry center 11xo between the opposite edges 11a1 of the first alignment reference mark 11 and the symmetry center 12xo between the outer edges 12a2 of the second alignment reference mark 12, on the basis of the X-direction position detection data Dx shown in FIG. 1B, using a predetermined method such as the symmetric pattern matching method. Also, the determination section 44a determines a circuit pattern alignment error in the X direction on the basis of a positional deviation Δx between the symmetry center 11xo of the first alignment reference mark 11 and the symmetry center 12xo of the second alignment reference mark 12. Namely, the positional deviation Δx between the symmetry center 11xo of the first alignment reference mark 11 and the symmetry center 12xo of the second alignment reference mark 12 is determined as a circuit pattern alignment error in the X direction. Similarly, on the basis of the Y-direction position detection data Dy shown in FIG. 1B, the determination section 44a determines the symmetry center 11yo between the opposite edges 11a1 of the first alignment reference mark 11 and the symmetry center 12yo between the outer edges 12a2 of the second alignment reference mark 12, using a predetermined method such as the symmetric pattern matching method. Also, the determination section 44a determines a circuit pattern alignment error in the Y direction on the basis of a positional deviation Δy between the symmetry center 11yo of the first alignment reference mark 11 and the symmetry center 12yo of the second alignment reference mark 12. Namely, the positional deviation Δy between the symmetry center 11yo of the first alignment reference mark 11 and the symmetry center 12yo of the second alignment reference mark 12 is determined as a circuit pattern alignment error in the Y direction.

Then, at step 3, an evaluation section 44b of the data processing section 44 evaluates dimensional accuracy of the second alignment reference mark 12 on the basis of the dimension detection data Dxd and Dyd. More specifically, the evaluation section 44b determines the dimension (width) dx of the line (vertical line in the illustrated example of FIG. 1B) 12a of the second alignment reference mark 12 on the basis of the X-direction dimension detection data Dxd and the dimension (width) dy of the line (horizontal line in the illustrated example of FIG. 1B) 12a of the second alignment reference mark 12 on the basis of the Y-direction dimension detection data Dyd, and then a determination is made as to whether the thus-determined dimensions (line widths) dx and dy of the second alignment reference mark 12 are each within a predetermined reference value range ds. If the line widths dx and dy are each within the predetermined reference value range ds (YES determination at step 3), the second alignment reference mark 12 is judged as accurate and hence reliable. If, however, either or both of the line widths dx and dy are not within the predetermined reference value range ds (NO determination at step 3), the second alignment reference mark 12 is judged as inaccurate and hence unreliable, so that the data processing section 44 carries out a predetermined error process at step 4.

Namely, in the error process of step 4, the data processing section 44 visually shows on the display unit 5 that the second alignment reference mark 12 is inaccurate, and performs necessary operations for eliminating the positional deviations Δx and Δy having been determined as a circuit patter alignment error at step 2 above. Namely, by thus eliminating the positional deviations Δx and Δy when either or both of the line widths dx and dy have been determined as failing to fall within the predetermined reference value range ds, it is possible to effectively avoid deterioration in the accuracy of the circuit-pattern alignment error measurement. Thus, the present invention can enhance the reliability of the circuit-pattern alignment error measurement. Also, the data processing section 44 displays, on the display unit 5, the positional deviations Δx and Δy, having been determined by the determination section 44a, as a circuit pattern alignment error, so that the user or human operator can visually ascertain the circuit pattern alignment error.

Various modifications are also possible without departing the basic principles of the present invention. Although the pattern-alignment-error measuring apparatus A of the present invention has been described as determining the line widths 12d of the second alignment reference mark 12 to be used for evaluating accuracy of the circuit pattern alignment error measurement, the present invention is not so limited. For example, the dimension 11d of the first alignment reference mark 11 may be determined, instead of the line width 12d of the second alignment reference mark 12, for the purpose of evaluating the accuracy of the circuit pattern alignment error measurement. Further, the first and second alignment reference marks provided on the wafer 1 may have any other suitable shapes than the above-mentioned as long as they are of symmetric shapes. For example, the first alignment reference mark 11 may be formed into a square frame shape similarly to the second alignment reference mark; in this case, the line dimension (width) of the first alignment reference mark 12 may be determined for evaluation of the accuracy of the circuit pattern alignment error measurement. Furthermore, the first and second alignment reference marks 11 and 12 may be formed parallelly, side by side, in the X or Y direction in predetermined positional relationship. Furthermore, whereas the inventive pattern-alignment-error measuring apparatus A has been described as moving the X-Y-Z table 2, the optical unit 3 may be moved for the measurement purposes; that is, it is only necessary that one of the X-Y-Z table 2 and optical unit 3 be moved relative to the other.

In summary, the pattern-alignment-error measuring apparatus and method are characterized by measuring the dimension of the first or second alignment reference mark in addition to evaluating the accuracy of the measurement of the pattern alignment error and also evaluating the dimension measurement of the first or second alignment reference mark. With this arrangement, the present invention can advantageously perform the pattern alignment error measurement with enhanced reliability. Further, the present invention is characterized in that the dimension detection data of the first or second alignment reference mark are obtained as the position detection data of the reference marks are obtained, so that the pattern alignment error measurement with enhanced accuracy and hence reliability can be performed in a short time.

What is claimed is:

1. An apparatus for measuring an error of alignment between a first pattern and a second pattern overlappingly formed on a same substrate, a first alignment reference mark of a predetermined symmetric shape being formed at a predetermined position of the substrate during formation of said first pattern, a second alignment reference mark of a predetermined symmetric shape being formed, in predetermined positional relationship to said first alignment reference mark, at a predetermined position of the substrate during formation of said second pattern, said apparatus comprising:

a detector that optically detects said first alignment reference mark and said second alignment reference mark formed on the substrate and thereby obtains dimension detection data of said first alignment reference mark or said second alignment reference mark as well as respective position detection data of said first and second alignment reference marks;

a determination section that determines respective symmetry centers of said first and second alignment reference marks on the basis of the respective position detection data of said first and second alignment reference marks and determines an error of the alignment between said first and second patterns on the basis of a positional deviation between the determined respective symmetry centers of said first and second alignment reference marks; and an evaluation section that determines whether the dimension detection data of said first alignment reference mark or said second alignment reference mark is within a predetermined reference value range and, if the dimension detection data is within the predetermined reference value range, judges the determination, by said determination section, of the error of the alignment between said first and second patterns to be accurate.

2. An apparatus as claimed in claim 1 wherein said detector optically detects a dimension of said first alignment reference mark or said second alignment reference mark.

3. An apparatus as claimed in claim 2 wherein the dimension of said first alignment reference mark or said second alignment reference mark is a line width of said first or second alignment reference mark.

4. An apparatus as claimed in claim 1 which further comprises a display that visually shows a positional deviation between respective symmetry centers of said first and second alignment reference marks as the error of the alignment between said first and second patterns.

5. An apparatus as claimed in claim 1 wherein said substrate is a semiconductor wafer.

6. A method for measuring an error of alignment between a first pattern and a second pattern overlappingly formed on a same substrate, a first alignment reference mark of a predetermined symmetric shape being formed at a predetermined position of the substrate during formation of said first pattern, a second alignment reference mark of a predetermined symmetric shape being formed, in predetermined positional relationship to said first alignment reference mark, at a predetermined position of the substrate during formation of said second pattern, said method comprising:

a step of optically detecting said first alignment reference mark and said second alignment reference mark and thereby obtains dimension detection data of said first alignment reference mark or said second alignment reference mark as well as respective position detection data of said first and second alignment reference marks;

a step of determining respective symmetry centers of said first and second alignment reference marks on the basis of the respective position detection data of said first and second alignment reference marks and determining an error of the alignment between said first and second patterns on the basis of a positional deviation between the respective symmetry centers of said first and second alignment reference marks; and a step of evaluating accuracy of determination, by said step of determining, of the error of the alignment between said first and second patterns by determining whether the dimension detection data of said first alignment reference mark or said second alignment reference mark is within a predetermined reference value range and, if the dimension detection data is within the predetermined reference value range, judges the determination, by said determination section, of the error of the alignment between said first and second patterns to be accurate.

7. A method as claimed in claim 6 wherein said step of optically detecting said first alignment reference mark and said second alignment reference mark includes a step of optically detecting a dimension of said first alignment reference mark or said second alignment reference mark.

8. A method as claimed in claim 7 wherein the dimension of said first alignment reference mark or said second alignment reference mark is a line width of said first or second alignment reference mark.

9. A machine-readable storage medium containing a group of instructions to cause said machine to perform a method for measuring an error of alignment between a first pattern and a second pattern overlappingly formed on a same substrate, a first alignment reference mark of a predetermined symmetric shape being formed at a predetermined position of the substrate during formation of said first pattern, a second alignment reference mark of a predetermined symmetric shape being formed, in predetermined positional relationship to said first alignment reference mark, at a predetermined position of the substrate during formation of said second pattern, said method comprising:

a step of optically detecting said first alignment reference mark and said second alignment reference mark and thereby obtains dimension detection data of said first alignment reference mark or said second alignment reference mark as well as respective position detection data of said first and second alignment reference marks;

a step of determining respective symmetry centers of said first and second alignment reference marks on the basis of the respective position detection data of said first and second alignment reference marks and determining an error of the alignment between said first and second patterns on the basis of a positional deviation between the respective symmetry centers of said first and second alignment reference marks; and a step of evaluating accuracy of determination, by said step of determining, of the error of the alignment between said first and second patterns by determining whether the dimension detection data of said first alignment reference mark or said second alignment reference mark is within a predetermined reference value range and, if the dimension detection data is within the predetermined reference value range, judges the determination, by said determination section, of the error of the alignment between said first and second patterns to be accurate.

* * * * *